US 6,969,689 B1

(12) United States Patent
Ramkumar et al.

(10) Patent No.: US 6,969,689 B1
(45) Date of Patent: Nov. 29, 2005

(54) METHOD OF MANUFACTURING AN OXIDE-NITRIDE-OXIDE (ONO) DIELECTRIC FOR SONOS-TYPE DEVICES

(76) Inventors: Krishnaswamy Ramkumar, 1193 Lynbrook Way, San Jose, CA (US) 95129; Manuj Rathor, 3480 Granada Ave., Apt. 172, Santa Clara, CA (US) 95051; Biju Parameshwaran, 116 Chesapeake Dr., Union City, CA (US) 94587; Loren Lancaster, 1030 Dark Horse Dr. West, Colorado Springs, CO (US) 80919

( * ) Notice: Subject to any disclaimer, the term of this patent is extended or adjusted under 35 U.S.C. 154(b) by 141 days.

(21) Appl. No.: 10/184,715

(22) Filed: Jun. 28, 2002

(Under 37 CFR 1.47)

(51) Int. Cl.$^7$ .......................... H01L 21/31; H01L 21/469
(52) U.S. Cl. ...................... 438/769; 438/770; 438/775; 438/786; 438/787; 438/791
(58) Field of Search ................................ 438/756–758, 438/769, 770, 775, 778, 786, 787, 791

(56) References Cited

U.S. PATENT DOCUMENTS

| | | | | |
|---|---|---|---|---|
| 5,940,736 A | * | 8/1999 | Brady et al. ................ | 438/787 |
| 5,968,593 A | * | 10/1999 | Sakamoto et al. ........ | 427/248.1 |
| 6,281,141 B1 | * | 8/2001 | Das et al. .................... | 438/770 |
| 6,339,000 B1 | * | 1/2002 | Bhattacharya et al. ...... | 438/261 |
| 6,348,420 B1 | * | 2/2002 | Raaijimakers et al. ...... | 438/769 |
| 6,388,279 B1 | * | 5/2002 | Sakai et al. ................. | 257/254 |
| 6,458,677 B1 | * | 10/2002 | Hopper et al. .............. | 438/591 |
| 6,541,816 B2 | * | 4/2003 | Ramsbey et al. ........... | 257/324 |
| 6,599,845 B2 | * | 7/2003 | Sato et al. .................. | 438/770 |
| 2003/0109111 A1 | * | 6/2003 | Hsieh et al. ................ | 438/400 |

OTHER PUBLICATIONS

Wolf and Tauber, "Silicon processing for the VLSI Era," vol. 1, Chapter 7, p 198–241, lattice press (1986).*
Wolf and Tauber, "Silicon processing for the VLSI Era," vol. 1, Chapter 6, p 161–197, lattice press (1986).*
Ma et al., "High performance Sub—0.25$\mu$m Devices Using Ultrathin Oxide–Nitride–Oxide Gate Dielectric Formed with Low Pressure Oxidation and Chemical Vapor Deposition", IEEE Electron devices, vol. 21 (6), p 316–318 (2000).*

* cited by examiner

*Primary Examiner*—Asok Kumar Sarkar
(74) *Attorney, Agent, or Firm*—Bradley T. Sako

(57) ABSTRACT

A method of forming oxide-nitride-oxide (ONO) dielectric of a SONOS-type nonvolatile storage device is disclosed. According to a first embodiment, a method may include the steps of forming a tunneling dielectric (step 102), forming a charge storing dielectric (step 104), and forming a top insulating layer (step 106) all in the same wafer processing tool. According to various aspects of the embodiments, all layers of an ONO dielectric of a SONOS-type device may be formed in the same general temperature range. Further, a tunneling dielectric may include a tunnel oxide formed with a long, low pressure oxidation, and a top insulating layer may include silicon dioxide formed with a preheated source gas.

18 Claims, 9 Drawing Sheets

METHOD OF MANUFACTURING AN OXIDE-NITRIDE-OXIDE (ONO) DIELECTRIC FOR SONOS-TYPE DEVICES

TECHNICAL FIELD

The present invention relates generally to dielectrics for field effect semiconductor devices, and more particularly to oxide-nitride-oxide (ONO) dielectrics for SONOS-type nonvolatile semiconductor devices.

BACKGROUND OF THE INVENTION

As is well known, semiconductor devices can include an insulated gate field effect transistor (IGFET) type device. IGFET-type devices typically include a transistor gate separated from a channel region by a dielectric. A potential applied to a gate can then be varied to alter channel conductivity.

While many IGFET type devices are volatile (e.g., conventional metal-oxide-semiconductor FETs), nonvolatile devices may also include IGFET-like approaches. Nonvolatile IGFET-like devices typically retain electric charge through one or more methods (e.g., storing, trapping charge). One conventional nonvolatile device can be a floating gate electrically erasable programmable read only memory (EEPROM). A floating gate EEPROM can include a floating gate electrode situated between a control gate and a channel. Charge, including electrons and/or "holes", may be stored in a floating gate electrode. Such a charge may alter a threshold voltage of a resulting nonvolatile IGFET-type device. As will be noted below, a drawback to any floating gate device can be higher programming and/or erase voltages with respect to other nonvolatile approaches.

Another nonvolatile IGFET type device can include a dielectric interface to trap charge. For example, devices have been proposed that include a metal gate formed over a dielectric of silicon nitride and silicon dioxide. Such devices have been referred to as metalnitride-oxide-semiconductor (MNOS) devices. A drawback to many MNOS devices has been lack of charge retention and/or uniformity of programming.

A third type of nonvolatile device may include one or more dielectric layers for storing charge. Such devices may be referred to generally as silicon-oxide-nitride-oxidesilicon (SONOS) type devices. One very basic type of SONOS device may include a polycrystalline silicon ("polysilicon") gate formed over a dielectric layer that includes a silicon nitride layer sandwiched between silicon dioxide layers.

SONOS devices can have lower programming voltages than other conventional nonvolatile devices, such as some types of floating gate devices. In addition, the SONOS fabrication process can be compatible with standard complementary metal oxide semiconductor (CMOS) process technology. To maintain this compatibility, SONOS devices may be scaled along with other transistors used in the process. The ability of SONOS devices to maintain performance and reliability as they are scaled can be an important feature.

To better understand the formation of SONOS devices, a conventional way of forming a SONOS device is set forth in FIGS. 11 and 12A to 12F. FIG. 11 is a flowchart illustrating various process steps involved in creating an integrated circuit containing SONOS devices. FIGS. 12A–12F set forth a number of side cross-sectional views of a portion of an integrated circuit containing SONOS devices following the various conventional process steps described in FIG. 12.

The conventional process described in FIG. 11 is designated by the general reference character 1100. A conventional process 1100 may include the steps of growing a tunnel oxide (step 1102) in a furnace. Subsequently, wafers that now include the tunnel oxide can be transferred from a furnace to a different machine for growing other layers in an ONO dielectric for a SONOS-type device. In FIG. 11, such a step may include transferring wafers to a chemical vapor deposition (CVD) machine (step 1104).

A conventional method 1100 may further include depositing a silicon nitride layer over tunnel oxide in a CVD machine (step 1106), depositing a top oxide layer over a nitride layer in the same or a different CVD machine (step 1108), and depositing a polysilicon gate layer (step 1110).

The above steps may form various layers for a SONOS-type device. Such layers can then be patterned to form a SONOS-type transistor. Patterning steps may include forming a gate mask (step 1112), etching gate structures (step 1114), and depositing and etching a spacer layer (step 1116).

Referring to FIG. 12A, a side cross-sectional view of a portion of an integrated circuit prior to the beginning of a conventional process 1100 is shown. An integrated circuit portion includes a substrate 1200, and may include isolation regions 1202 formed by prior process steps. As an example, isolation regions 1202 may be formed by various conventional isolation processes including but not limited to shallow trench isolation (STI) or the local oxidation of silicon (LOCOS).

It is noted that a substrate 1200 may also include various impurity regions, formed by ion implantation and/or other diffusion methods. As but a few examples, n-type wells may be formed in a p-type substrate (or vice versa), or p-type wells may be formed within n-type wells (or vice versa).

Referring again to FIG. 11, a conventional process 1100 may begin by growing a tunnel oxide (step 1102) in a furnace. A portion of an integrated circuit following step 1102 is set forth in FIG. 12B. Referring to FIG. 12B, a portion of an integrated circuit includes a tunnel oxide 1204 on a substrate 1200.

A conventional process 1100 can continue by transferring a wafer from a furnace to a chemical vapor deposition (CVD) machine (step 1104). A conventional process 1100 can continue by depositing a silicon nitride layer in a CVD machine (step 1106). A portion of an integrated circuit following step 1104 is set forth in FIG. 12C. Referring to FIG. 12C, an integrated circuit may now be situated within a CVD machine. The integrated circuit portion can now include a nitride layer 1206 deposited over a tunnel oxide 1204. A nitride layer 1206 can conventionally include essentially only silicon nitride ($Si_3N_4$).

A conventional process 1100 can continue by depositing a top oxide layer (step 1108) in a chemical vapor deposition (CVD) machine. Referring to FIG. 12D, an example of a portion of an integrated circuit following step 1106 is set forth. A tunnel oxide 1204, a nitride layer 1206 and a top oxide layer 1208 may now be formed over a substrate 1200. A top oxide layer 1208 can be conventionally formed by chemical vapor deposition (CVD).

At this point, in a conventional process 1100, three layers of an ONO dielectric have been created in at least two different machines. More particularly, a tunnel oxide 1204 may be formed in one machine (a furnace particular adapted for growing an oxide), while a nitride layer 1206 and/or a top oxide layer 1208 may be formed in a different machine (a machine particularly adapted for depositing CVD films)

A conventional process 1100 can continue by depositing a polysilicon gate layer (step 1110). An example of a portion of an integrated circuit following a step 1108 is set forth in FIG. 12E. Referring to FIG. 12E, a polysilicon gate layer 1210 has been deposited on a top oxide layer 1208. As also shown in FIG. 12E, a gate protection insulator 1213 may also be formed over polysilicon gate layer 1210. It is noted that a polysilicon gate layer 1210 is conventionally formed in a different reaction chamber than the previous oxide-nitride-oxide layers. Further, a gate protection insulator 1213 may be formed in a different reaction chamber than a polysilicon gate layer 1210.

At this point, in a conventional process 1100, the silicon-oxide-nitride-oxide-silicon (SONOS) layers can correspond to a substrate 1200, tunnel oxide 1204, nitride layer 1206, top oxide layer 1208, and polysilicon gate layer 1210, respectively.

A conventional process 1100 may continue with lithography and etch steps to isolate and form SONOS devices. In conventional lithography, a gate mask may first be formed (step 1112). An example of a portion of an integrated circuit following step 1110 is set forth in FIG. 12E. A gate mask material 1212 can be deposited and patterned using any of various lithographic techniques. A gate mask material 1212 may generally consist of a photoresist material.

Following the formation of a gate mask (step 1112), gate structures can be etched (step 1114). Referring now to FIG. 12F, a portion of an integrated circuit following step 1112 is set forth. A suitable etching process can remove portions of the tunnel oxide 1204, nitride layer 1206, top oxide layer 1208, and polysilicon gate layer 1210 that are not covered by gate mask material 1212. In this manner, SONOS device gate structures 1216 can be formed on a substrate 1200.

A conventional process 1100 can continue by depositing and etching a spacer layer (step 1116). An example of a portion of an integrated circuit following step 1116 is set forth in FIG. 12F. Referring to FIG. 12F, a spacer layer 1214 can be formed that surrounds and electrically isolates SONOS gate structures 1216. A spacer layer 1214 may include silicon dioxide. Note that in FIG. 12F, a gate mask layer 1212 has been removed by suitable process means.

While the conventional process described may produce an integrated circuit containing SONOS devices of reasonable quality and performance, certain aspects of a process may be important in maintaining device performance and/or reliability. This can be particularly true as SONOS devices are scaled to realize lower programming voltages and/or in order to maintain compatibility with CMOS process technology.

ONO dielectric layers in SONOS-type devices may suffer from certain drawbacks as a SONOS-type device is scaled down, particularly as the thickness of the dielectric layers are scaled down to a point at which a tunnel oxide 1204 can be less than 25 Å thick, a nitride layer 1206 can be less than 100 Å thick and a top oxide layer 1208 can be less than 50 Å thick.

A tunnel oxide 1204 can provide an insulating layer between a silicon substrate and a nitride layer 1206. A nitride layer 1206 can be a dielectric layer between a tunnel oxide 1204 and a top oxide layer 1208 that can trap and/or store electric charge. A top oxide layer 1208 can function to electrically isolate a nitride storage layer 1206 and a polysilicon gate layer 1210.

For the reasons set above, the quality of a tunnel oxide 1204, a nitride layer 1206 and a top oxide layer 1208 can be important features in an ONO dielectric of a SONOS-type device.

The performance of an ONO dielectric of a SONOS-type device can be affected by various factors including thickness, uniformity of thickness, particle count, stress in the dielectric layers, and the quality of a interfaces present in an ONO dielectric.

Thickness can be an important character of an ONO dielectric in a SONOS-type device as a thin but robust dielectric can be important in maintaining device performance and reliability. This may be particularly important as SONOS devices are scaled to realize lower programming voltages and/or integrated to be compatible with decreasing geometry CMOS process technology.

Uniformity of the thickness of dielectric layers across a wafer can also be an important feature in a process. Uniformity in layer properties across a wafer can translate into uniformity in the performance of all devices formed on at the same wafer. This can increase yields and help ensure that device specifications are met.

Particle count can be another important character of ONO dielectric of SONOS-type devices. Increased particle account typically results in direct reductions in yields. Consequently, minimizing particle count is typically a continuing goal in semiconductor manufacturing processes.

Stress may also reduce the quality of ONO dielectric layers of SONOS-type devices.

In particular, stress may occur when different materials undergo thermal expansion at different rates. Temperature variation can be the main cause of the thermal expansion that can lead to stress in different dielectric layers. Stress can cause cracking in the dielectric layers, spiking in metal lines and/or void formation in conductive layers, thus reducing the quality of an ONO dielectric.

Interface quality may be affected by foreign elements, or the like. Such foreign elements may typically be introduced at an interface during a manufacturing process. As but a few of the many possible examples, foreign elements may include organic films, undesirable elements like boron, and/or particles.

A conventional manufacturing process for a SONOS-type device, such as that described above, can have various drawbacks. In a conventional process, wafers can be transferred to different machines for manufacturing different layers. For example, a tunnel oxide 1204 can be grown in one machine, while the remaining layers including a nitride layer 1206 and a top oxide layer 1208 can be deposited in another machine. A transfer of wafers among different machines can facilitate the introduction of foreign particles or elements onto a wafer, and thus increase a particle count for a wafer. Further, such particles or elements may settle at an interface between dielectric layers. This may adversely affect the performance of an ONO dielectric.

A conventional process can also subject wafers to broad temperature changes in forming different dielectric layers. This may also increase the particle count and increase the stress in dielectric layers. In particular, different layers of a SONOS-type dielectric can be formed under different temperature ranges. In addition to increasing stress, resulting temperature cycles can also cause variations of thickness in different parts of dielectrics.

In light of the limitations of the conventional process set forth above, it would be desirable to provide a method of forming ONO dielectric layers for a SONOS-type device that may have a higher quality than conventional approaches.

SUMMARY OF THE INVENTION

According to one embodiment of the present invention, a method for forming a plurality of semiconductor device layers may include the steps of forming a tunnel dielectric layer on a substrate of a semiconductor device. Such a layer may be formed in a particular wafer processing tool. A method may also include forming a charge storing dielectric in the same wafer processing tool. In this way, at least a tunnel dielectric and a charge storage dielectric of an ONO dielectric in a SONOS-type device may be formed in situ.

It is understood that the use of the term "ONO" dielectric with regard to the invention should not be construed as being limited to particular dielectric materials. As but one example, a middle layer (corresponding to an "EN" in "ONO") is not meant to imply stoichiometric silicon nitride, and may include non-stoichiometric silicon nitride, and preferably silicon oxynitride.

One aspect of the invention relates to a method that may include an in situ formation of a tunnel dielectric, charge storing dielectric and top insulating layer. That is, all three layers of an ONO dielectric in a SONOS-type device may be formed in situ.

According to another aspect of the invention, a tunnel dielectric, charge storing dielectric and top insulating layer may all be formed in the same reaction chamber of a wafer processing tool.

According to another aspect of the invention, a tunnel oxide for an ONO dielectric may be formed by oxidizing for a longer time and/or at a lower pressure than many conventional approaches. For example, the low pressure may be less than or equal to 1,400 mTorr and the oxidation time may be greater than or equal to one hour.

According to another aspect of the invention, a top insulating layer of an ONO dielectric may be formed with a preheated source gas. For example, in the case of a top insulating layer of silicon dioxide, a preheated gas may include nitrous oxide.

According to another aspect of the invention, a tunnel dielectric, charge storing dielectric, and top insulating layer formed by the inventive method may have a collective thickness of less than 200 angstroms.

According to another aspect of the invention, an ONO dielectric for a SONOS-type device may include a tunnel dielectric comprising silicon dioxide, a charge storing dielectric comprising silicon oxynitride, and a top insulating layer comprising silicon dioxide. One or more of these layers may be formed by the inventive method and may have a collective thickness of less than 200 angstroms.

According to another aspect of the invention, a method of forming an ONO dielectric for a SONOS-type device may include forming a tunnel dielectric, charge storing dielectric, and top insulating layer within a first temperature range. Such a temperature range may vary by no more than about 60° C. from lowest temperature to highest temperature (e.g., from x to x+60° C., x being a temperature of from 700 to 875° C.).

According to another one aspect of the invention, a method of forming an ONO dielectric for a SONOS-type device may include positioning wafers within a processing furnace with a wafer-to-liner spacing in the range of about 2.5 to 6 cm.

DETAILED DESCRIPTION OF THE EMBODIMENTS

Various embodiments of the present invention will now be discussed in conjunction with a number of figures. The embodiments set forth approaches to forming ONO dielectric layers for a SONOS-type device. It is understood that the use of the term "ONO" dielectric with regard to the various embodiments should not be construed as being limited to particular dielectric materials. As but one example, a middle layer (corresponding to an "N" in "ONO") is not meant to imply stoichiometric silicon nitride, and may include non-stoichiometric silicon nitride, and preferably silicon oxynitride.

Figure 1:
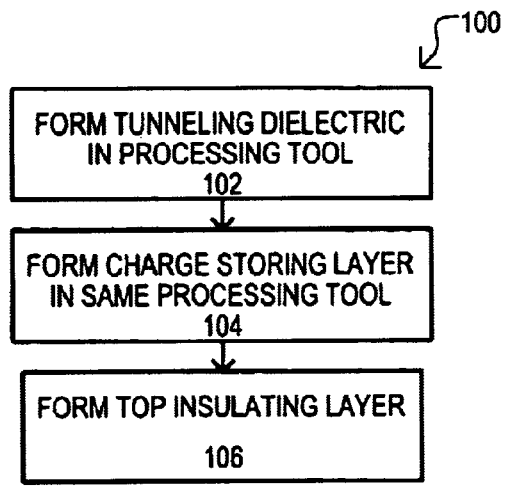
FIG. 1 is a block diagram showing a method of manufacturing an ONO dielectric for a SONOS-type device according to one embodiment.

A first embodiment may include a method for in situ formation of an ONO dielectric layer for a SONOS-type device. That is, the formation of all layers of an ONO dielectric may occur at one location. A flow diagram is set forth in FIG. 1 that describes a first embodiment of the present invention. A first embodiment is designated by the general reference character 100, and may include the steps of forming a tunnel dielectric layer in a wafer processing tool (step 102), forming a charge storing layer in the same wafer processing tool (step 104), and forming a top insulating layer (step 106). FIGS. 2A–2D set forth a number of side cross-sectional views of a portion of an integrated circuit containing an ONO dielectric following the various process steps described in FIG. 1.

Figure 2A:
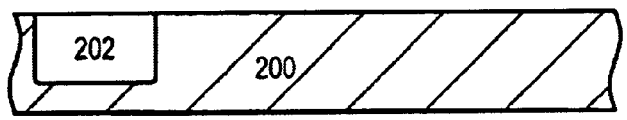
FIGS. 2A to 2D are side cross-sectional views showing the method of FIG. 1.

Referring to FIG. 2A, a side cross-sectional view is set forth showing a portion of an integrated circuit prior to a method according to a first embodiment 100. An integrated circuit portion includes a substrate 200; and may include an isolation region 202 formed by prior conventional process steps. In addition, a substrate 200 may include impurity regions, such as wells and/or channel regions.

Figure 2B:
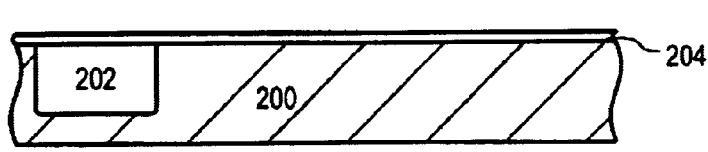

Referring back to FIG. 1, a first embodiment 100 may include forming a tunnel dielectric layer (step 102) in a wafer processing tool. A portion of an integrated circuit following a step 102 is set forth in FIG. 2B. FIG. 2B shows a portion of an integrated circuit that includes a tunnel dielectric layer 204 formed on a substrate 200. A tunnel dielectric layer 204 can be generally thin with respect to other device layers, and may have a thickness of less than about 25 Å, preferably less than about 20 Å, even more preferably less than about 15 Å.

A first embodiment 100 can continue by depositing a charge storing layer (step 104) over a tunnel dielectric layer 204 in the same wafer processing tool. Thus, unlike conventional approaches that may transfer a wafer between tools, a wafer may remain in an original oxide growing tool, and hence form in situ a tunnel dielectric and charge storing layer.

Figure 2C:
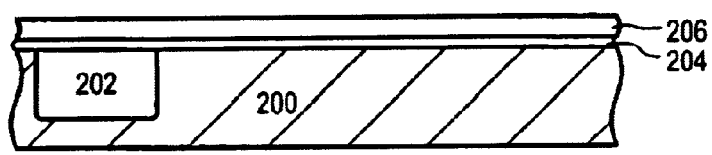

A portion of an integrated circuit following step 104 is set forth in FIG. 2C. Referring now to FIG. 2C, an integrated circuit portion may now includes a charge storing layer 206 deposited over a tunnel dielectric layer 204. A charge storing layer 206 may include stoichiometric silicon nitride ($Si_3N_4$), silicon oxynitride, and/or silicon-rich silicon nitride (see, e.g., commonly owned, co-pending U.S. patent application Ser. No. 09/920,378, titled *Semiconductor Device Having Silicon-Rich Layer and Method of Manufacturing Such a Device*, assigned to Cypress Semiconductor Corporation, and filed on Jul. 31, 2001). In one arrangement, a charge storing layer 206 may have a thickness of less than about 200 Å, preferably less than about 150 Å, more preferably less than about 100 Å. As one example, a charge storing layer may be less than about 95 Å. Silicon nitride (or a similar such material) may be formed with low pressure chemical vapor deposition techniques LPCVD. Base materials of an LPCVD process may include ammonia ($NH_3$), dichlorosilane (DCS), and/or nitrous oxide ($N_2O$).

Figure 2D:
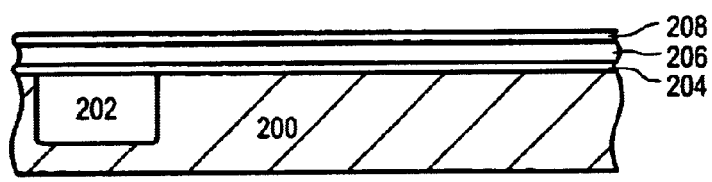

A first embodiment 100 can continue by forming a top insulating layer (step 106). Referring to FIG. 2D, an example of a portion of an integrated circuit following a step 106 is set forth. A top insulating layer 208 may be formed over a charge storing layer 206. A top insulating layer 208 may be formed by low-pressure chemical vapor deposition (LPCVD). In one particular arrangement, a top insulating layer may include LPCVD silicon dioxide. Preferably, a top insulating layer 208 may be formed in the same wafer processing tool as a tunnel dielectric 204 and a charge storing layer 208. Hence, preferably, all three layers of an ONO dielectric for a SONOS-type device may be formed in situ.

Unlike conventional approaches for forming an ONO dielectric for SONOS-type devices, a tunnel dielectric layer 204, a charge storing layer 206 and a top insulating layer 208 can be formed in the same wafer processing tool without transferring a wafer between different wafer processing tools. In this way, a high-quality ONO dielectric for SONOS-type device may be achieved without variations in the thickness of the dielectric layers and/or particle count values that may occur in conventional approaches.

An ONO dielectric according to a first embodiment may result in a higher performance SONOS device that may be scaled to lower programming voltages and yet maintain compatibility with a conventional CMOS process.

Figure 3:
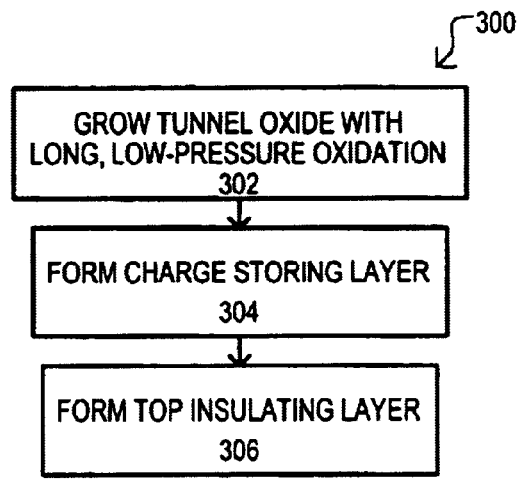
FIG. 3 is a block diagram showing a method of manufacturing an ONO dielectric for a SONOS-type device according to another embodiment.

A second embodiment of the present invention will now be described with reference to FIGS. 3 and 4.

A second embodiment may include a method for forming an ONO dielectric for a SONOS-type device that includes a tunneling oxide formed at a lower pressure for a longer period of time than conventional approaches. A flow diagram is set forth in FIG. 3 that describes a second embodiment of the present invention.

A second embodiment is designated by the general reference character 300, and may include the steps of growing a tunnel oxide layer with a long, low-pressure oxidation (step 302), depositing a charge storing layer (step 304), and forming a top insulating layer (step 306). FIGS. 4A–4D set forth a number of side cross-sectional views of a portion of an integrated circuit containing an ONO dielectric following the various process steps described in FIG. 3.

Figure 4A:
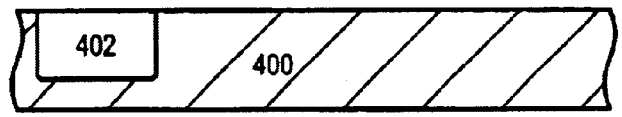
FIGS. 4A to 4D are side cross-sectional views showing the method of FIG. 3.

Referring to FIG. 4A, a side cross-sectional view of a portion of an integrated circuit prior to a third embodiment process 300 is shown. An integrated circuit portion can include a substrate 400, and may include an isolation region 402 formed by prior conventional process steps. In addition, a substrate may include impurity regions, such as wells and/or channel regions.

A second embodiment 300 may include growing a tunnel dielectric layer with a long, low-pressure oxidation (step 302). Such an oxidation step may occur at a lower pressure and longer time than tunnel oxide formation steps for other conventional SONOS manufacturing approaches. A suitable pressure according to a step 302 may be less than about 2,000 milliTorr (mTorr), preferably less than about 1,500 mTorr, more preferably less than about 1,380 mTorr. A suitable oxidation time according to a step 302 may have a duration of greater than about 45 minutes, preferably greater than about 1 hour, and more preferably greater than about 1 hour and 40 minutes.

It is noted that a long, low pressure oxidation step as noted above may result in a more uniform oxide than conventional approaches that may form a tunneling dielectric at higher pressures and/or for shorter periods of time. Further, such a step may be in contradiction to many conventional manufacturing processes that purposely seek to reduce the time required to perform a particular process step.

Figure 4B:
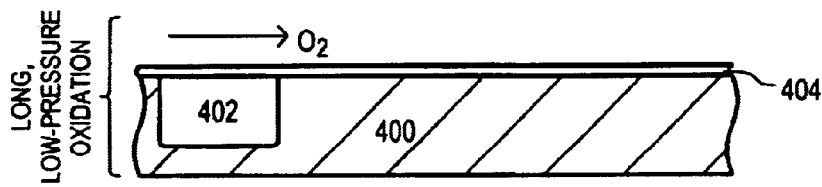

A portion of an integrated circuit following a step 302 is set forth in FIG. 4B. Referring to FIG. 4B, a portion of an integrated circuit includes a tunnel oxide layer 404 that has been grown on a substrate 400. A tunnel dielectric layer 404 can be generally very thin with respect to other device layers, and may have a thickness of less than about 50 Å thick, preferably less than 30 Å, more preferably about 20 Å.

Figure 4C:
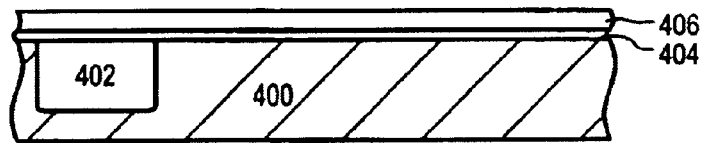

A second embodiment of the method 300 can continue by forming a charge storing layer (step 304). A portion of an integrated circuit following a step 304 is set forth in FIG. 4C. Referring now to FIG. 4C, an integrated circuit portion can include a charge storing layer 406 formed over a tunnel dielectric layer 404. A charge storing layer 406 may be a silicon nitride. A silicon nitride may include silicon-rich or stoichiometric silicon nitride ($Si_3N_4$), but preferably comprises silicon oxynitride ($Si_xN_yO_z$).

In one particular arrangement, a charge storing layer 406 may have a thickness of less than about 200 Å, preferably less than about 120 Å, more preferably about 95 Å. A silicon nitride (or a similar such material) may be formed with low pressure chemical vapor deposition techniques (e.g., LPCVD). Base materials of such an LPCVD process may include ammonia ($NH_3$), dichlorosilane (DCS), and/or nitrous oxide ($N_2O$).

Figure 4D:
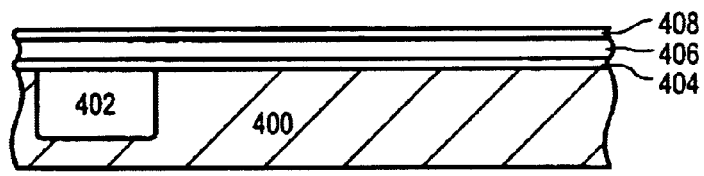

A second embodiment 300 can continue by forming a top insulating layer (step 306). Referring to FIG. 4D, an example of a portion of an integrated circuit following a step 306 is set forth. A tunnel dielectric layer 404, a charge storing layer 406, and a top insulating layer 408 may all be formed on a substrate 400. In one very particular arrangement, a top insulating layer 408 may include silicon dioxide.

In one particular arrangement, a top insulating layer 408 may have a thickness of about 100 Å, preferably less than about 50 Å, more preferably about 40 Å. A top insulating layer 408 may be formed by low-pressure chemical vapor deposition (LPCVD). Base materials of such an LPCVD process may include dichlorosilane (DCS), and nitrous oxide ($N_2O$), for example.

Figure 5:
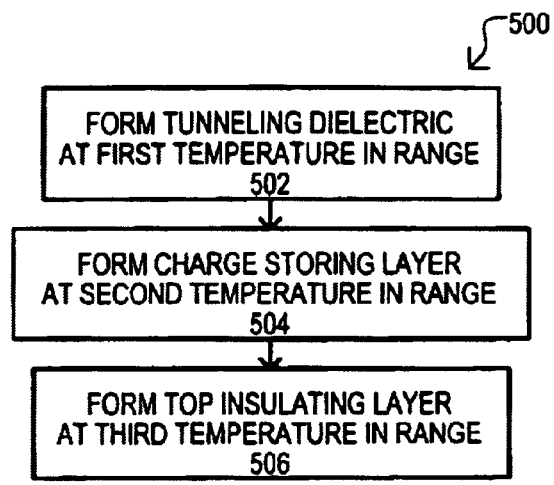
FIG. 5 is a block diagram showing a method of manufacturing an ONO dielectric for SONOS-type device according to another embodiment.

A third embodiment of the present invention will now be described with reference to FIGS. 5 and 6.

A third embodiment may include a method for forming various layers of an ONO dielectric for a SONOS-type device within the same general temperature range. A flow diagram is set forth in FIG. 5 that describes a third embodiment of the present invention. A third embodiment is designated by the general reference character 500, and may include the steps of forming a tunnel dielectric layer at a first temperature in a range (step 502), depositing a charge storing layer at a second temperature within the range (step 504), and forming a top insulating layer at a third temperature within the range (step 506). FIGS. 6A–6D set forth a number of side cross-sectional views of a portion of an integrated circuit containing an ONO dielectric for a SONOS-type device following the various process steps described in FIG. 5.

A suitable temperature range according to a third embodiment may be less than about a 200° C. variation, preferably less than about a 100° C. variation, more preferably less than about a 50° C. variation. This embodiment is particularly applicable to the method embodiment where the tunnel oxide, charge storing layer, and top insulating layer are formed in situ.

Figure 6A:
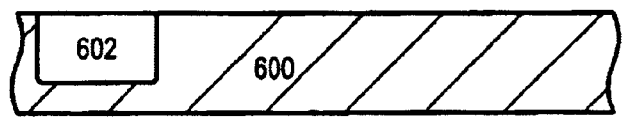
FIGS. 6A to 6D are side cross-sectional views showing the method of FIG. 5.

Referring to FIG. 6A, a side cross-sectional view of a portion of an integrated circuit prior to the start of a third embodiment process 500 is shown. An integrated circuit portion includes a substrate 600, and may include an isolation region 602 formed by prior conventional process steps. In addition, a substrate 600 may include impurity regions, such as wells and/or channel regions.

Figure 6B:
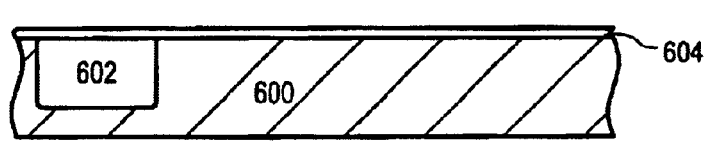

The third embodiment 500 may begin by growing a tunnel dielectric layer at a first temperature range (step 502) at a first temperature in the range of about 700° C. to about 875 ° C., preferably about 725° C. to about 850° C., and more preferably about 760° C. to about 800 ° C. A portion of an integrated circuit following a step 502 is set forth in FIG. 6B. Referring to FIG. 6B, a portion of an integrated circuit includes a tunnel dielectric layer 604 on a substrate 600. A tunnel dielectric layer 604 can be generally very thin with respect to other device layers, and may be on the order of about 20 Å thick. Preferably, a tunnel dielectric 604 may be formed by a long, low-pressure oxidation as described in conjunction with FIG. 3.

A third embodiment 500 can continue by depositing a charge storing layer (step 504) over a tunnel dielectric layer 604 at a second temperature within the range. A portion of an integrated circuit following step 504 is set forth in FIG. 6C.

Figure 6C:
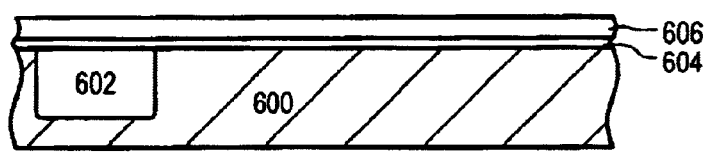

Referring now to FIG. 6C, an integrated circuit portion may include a charge storing layer 606 deposited over a tunnel dielectric layer 604. A charge storing layer 606 may include a silicon nitride formed with LPCVD techniques. Such an LPCVD step may occur at a second temperature in the range noted above. In particular, the second temperature may be from about 700° C. to about 875° C., preferably about 725° C. to about 850° C., and more preferably about 760° C. to about 800° C. In one arrangement, a charge storing layer 606 may include silicon oxynitride at a thickness of about 80 to -about 100 Å, as but one example. Base materials of such an LPCVD process may include ammonia ($NH_3$), dichlorosilane (DCS), and/or nitrous oxide ($N_2O$).

Figure 6D:
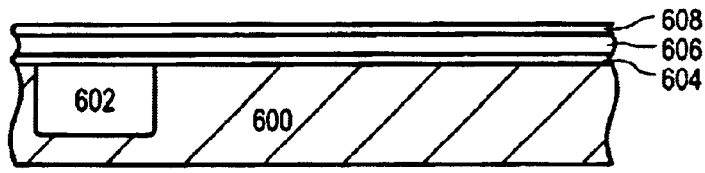

A third embodiment 500 can continue by forming a top insulating layer in the temperature range defined above (step 506). Referring to FIG. 6D, an example of a portion of an integrated circuit following a step 506 is set forth. A substrate 600 may now include a tunnel dielectric layer 604, a charge storing layer 606, and a top insulating layer 608. In one very particular arrangement, a top insulating layer 608 may be formed by LPCVD. Such an LPCVD step may occur at a third temperature in the range noted above. In particular, the third temperature may be from about 700° C. to about 875° C., preferably about 725° C. to about 850° C., and more preferably about 760° C. to about 800° C. Base materials of such an LPCVD process may include dichlorosilane (DCS), and nitrous oxide ($N_2O$), as but one example.

A third embodiment 500 may therefore result in an integrated circuit containing an ONO dielectric for SONOS-type device in which a tunneling dielectric, charge storing layer, and top dielectric are all formed within a relatively narrow same temperature range. Such an approach may reduce stress within layers and/or reduce particle counts on a wafer. In this way, an ONO dielectric for a SONOS-type device may be formed having greater reliability and/or with greater yield than conventional approaches having wider variation in temperature between layer formation steps.

A fourth embodiment of the present invention will now be described with reference to FIGS. 7 and 8A–8D.

Figure 7:
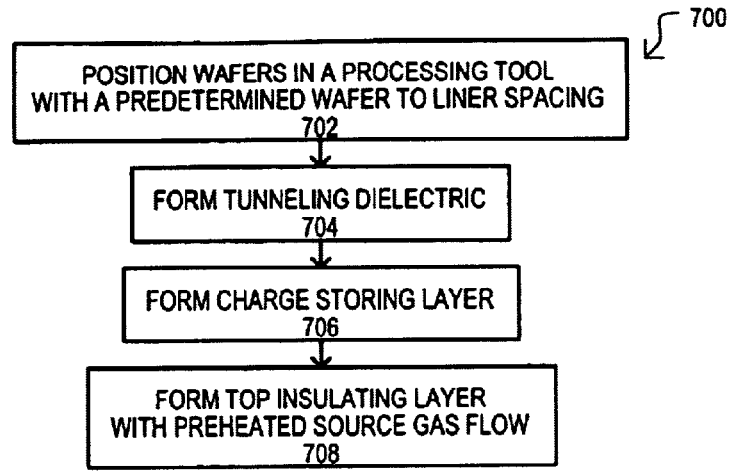
FIG. 7 is a block diagram showing a method of manufacturing an ONO dielectric for SONOS-type device according to another embodiment.
Figure 8A:
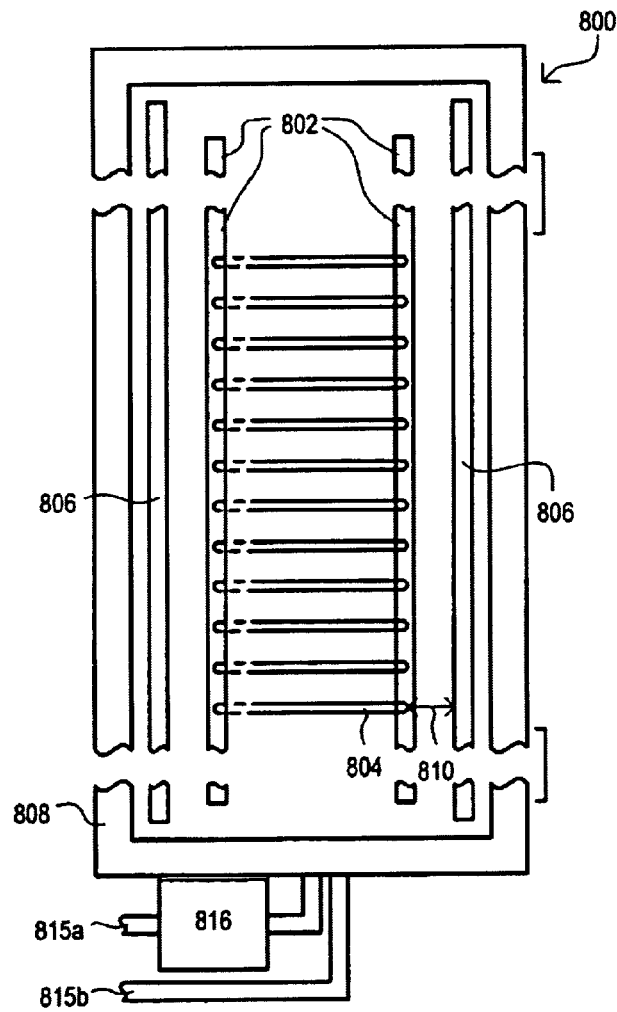
FIG. 8A is a side cross-sectional view of a wafer processing tool that may be used in the present invention.
Figure 8B:
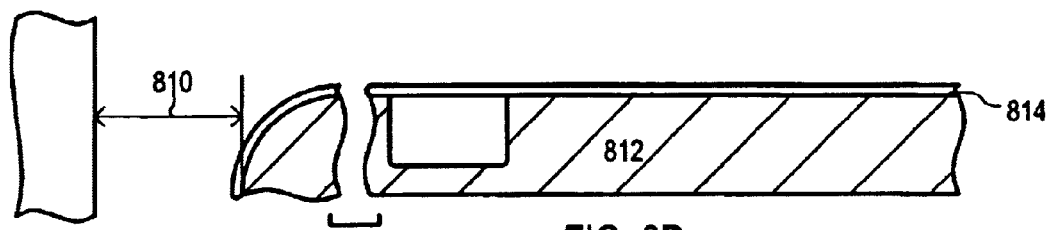
FIGS. 8B to 8D are side cross-sectional views showing the method of FIG. 7.
Figure 8C:
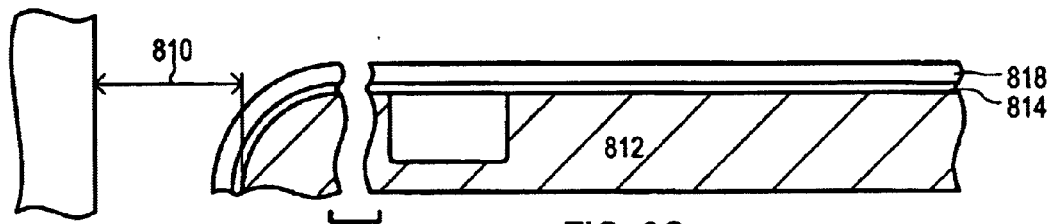
Figure 8D:
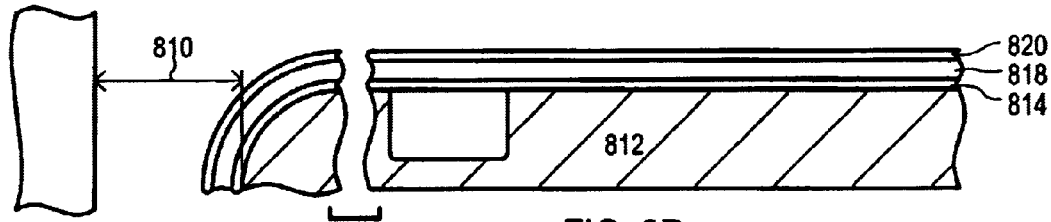

The fourth embodiment can include a method for in situ formation of an ONO dielectric for SONOS-type device. A flow diagram is set forth in FIG. 7 that describes a fourth embodiment of the present invention. FIG. 8A sets forth a side cross-sectional view of a wafer processing tool that may be used in one embodiment. FIGS. 8B–8D set forth a number of side cross-sectional views of a portion of an integrated circuit containing an ONO dielectric that illustrate the method of FIG. 7. A method according to the fourth embodiment is shown in FIG. 7, and designated by the general reference character 700. A method 700 may include the steps of positioning a wafer in a wafer processing tool with a minimum wafer-to-liner spacing (step 702), forming a tunnel dielectric layer (step 704), forming a charge storing layer (step 706), and forming a top insulating layer with a preheated source gas flow (step 708).

Referring to FIG. 8A, a side cross-sectional view of a wafer processing tool that may be used in the present invention is set forth. As shown in FIG. SA, a wafer processing tool 800 may include a wafer holder or a wafer "boat" 802. A wafer boat 802 may be capable of holding a number of wafers (one of which is shown as item 804), and may typically formed from quartz. As shown in FIG. 8A, a wafer processing tool 800 may also include a liner 806 and a furnace "tube" 808. A liner 806 may circumscribe an inner circumference of a tube 808. A distance between an outer edge of a wafer 804 and a liner 806 can be considered a wafer-to-liner spacing 810.

As noted above, a fourth embodiment 700 may include positioning a wafer in a wafer processing tool with a predetermined wafer-to-liner spacing (step 702). Thus, if reference is made to FIG. 8A, in accordance with a step 702, a wafer-to-liner spacing 810 may have a predetermined value. In one very particular example, a wafer-to-liner spacing 810 may be about 2.5 cm to about 6.0 cm, preferably about 3.0 cm to about 4.5 cm, more preferably about 3.5 cm.

A fourth embodiment 700 may further include forming a tunnel dielectric layer (step 704). A portion of an integrated circuit following step 704 is set forth in FIG. 8B. Referring to FIG. 8B, a portion of an integrated circuit includes a tunnel dielectric layer 814 on a substrate 812. A tunnel dielectric layer 814 can be generally thin with respect to other device layers, and may be on the order of about 20 Å thick. Preferably, such a layer may be formed by a long, low-pressure oxidation step, such as that described above with reference to FIG. 3.

FIG. 8B also shows a representation of a wafer-to-liner spacing 810, which as noted above, can have a predetermined minimum value.

A fourth embodiment 700 can continue by forming a charge storing layer (step 706). Referring to FIG. 8C, a portion of an integrated circuit is shown to include a charge storing layer 818 formed over tunnel dielectric layer 818. A charge storing layer 818 may have a thickness of about 100 Å. Preferably, such a layer may be formed by the various methods described above with reference to FIG. 3. FIG. 8C also shows a representation of a wafer-to-liner spacing 810, which as noted above, can have a predetermined minimum value.

A fourth embodiment 700 can continue by forming a top insulating oxide layer with a preheated source gas flow (step 708). If reference is made back to FIG. 8A, a source gas can be preheated in a heater 816 before being introduced into a wafer processing tool 800. A source gas 814 may be a gas that contains one or more elements of a resulting film or layer. Referring to FIG. 8D, an example of a portion of an integrated circuit following step 708 is set forth. A substrate 802 now includes a tunnel dielectric layer 814, a charge storing layer 818, and a top insulating layer 820. In one very particular arrangement, a top insulating layer 810 may be formed by low-pressure chemical vapor deposition (LPCVD) with DCS and preheated $N_2O$ as source gases.

If reference is made back to FIG. 8A, a source gas can be preheated in a heater 816 before being introduced into a wafer processing tool 800. A source gas 814 may be a gas that contains one or more elements of a resulting film or layer. Source gases may be applied by way of one or more preheating inputs (one example is shown as 815a) and/or one or more non-preheating inputs (one example is shown as 815b).

In one particular arrangement, a source gas may be preheated to a temperature in the range of about 300° C. to 500° C., preferably about 350° C. to 450° C., and more preferably at about 400° C. Further, a top insulating layer comprises silicon dioxide, and a processing gas may comprise a nitrous oxide ($N_2O$). Forming a top insulating layer in accordance with a step 708 may include depositing a top insulating layer over a charge storing layer in the same wafer processing tool in which a tunneling dielectric is formed.

A portion of an integrated circuit following a step 708 is set forth in FIG. 8D. Referring now to FIG. 8D, an integrated circuit portion may include a top insulating layer 820 formed over a charge storing layer 818, which is formed over a tunnel dielectric layer 814. As noted above, a top insulating layer 820 may include silicon dioxide. Preferably, a top insulating layer 820 may include a silicon dioxide formed with low pressure chemical vapor deposition techniques (LPCVD). Base materials of such an LPCVD process may dichlorosilane (DCS) and preheated nitrous oxide ($N_2O$)

In this way, a method of fabricating an ONO dielectric for SONOS-type device may include forming layers in a furnace with a predetermined wafer-to-liner spacing. This may improve uniformity of dielectric layers over other approaches. Still further, a source gas (e.g., $N_2O$) may be preheated prior to entering a reaction chamber. This too, may improve the uniformity of a resulting top insulating layer (e.g., silicon dioxide).

A fifth embodiment of the present invention will now be described with reference to FIGS. 9 and 10.

The fifth embodiment includes a method for manufacturing nonvolatile memory transistors that includes an in situ formed ONO dielectric for SONOS-type devices. A flow diagram illustrating a fifth embodiment is shown in FIG. 9. FIGS. 10A to 10E set forth a number of side cross-sectional views of a portion of an integrated circuit containing nonvolatile memory transistors following the various process steps described in FIG. 9.

A method according to a fifth embodiment 900 may include the steps of positioning wafers in a wafer processing furnace with a predetermined wafer-to-liner spacing (step 902), forming a tunnel oxide layer with a long, low-pressure oxidation in a predetermined temperature range in the wafer processing furnace (step 904), purging the wafer processing furnace with a purging gas (step 906), forming an oxynitride layer within the predetermined range and same wafer processing furnace (step 908), purging the wafer processing furnace with a purging gas (step 910), forming a top insulating layer in the same wafer processing furnace and same temperature range with a preheated processing gas (step 912), forming a conductive gate layer (step 914), forming a gate etch mask (step 916), etching gate structures (step 918), and depositing and etching a spacer layer (step 920).

As noted above, a fifth embodiment 900 may include the step of positioning a wafer in a wafer processing furnace with a predetermined wafer-to-liner spacing (step 902). Such a step may be essentially the same as step 702 of a fourth embodiment. Namely, a wafer may have a wafer-to-liner spacing of about 2.5 cm to about 6.0 cm, preferably about 3.0 cm to about 4.5 cm, more preferably about 3.5 cm.

A fifth embodiment 900 may continue by forming a tunnel oxide layer. Such a step may include a long, low pressure oxidation within a predetermined temperature range in a wafer processing furnace (step 902). In one particular arrangement, a step 902 may include growing oxide in a furnace at a pressure in the general range of about 400 mTorr to about 1500 mTorr, preferably about 500 mTorr to about 1375 mTorr. An oxidizing temperature may be in the general range of about 600 to about 1000° C., preferably about 700 to about 850° C., more preferably about 750 to about 810° C. Oxygen gas ($O_2$) may flow at a rate in the range of about 100 standard cubic centimeters per minute (sccm) to -about 300 sccm, more preferably about 200 sccm. Such an oxidation may take between about 1 to about 3 hours, preferably about 1 to about 2 hours, even more preferably about 1 hour and 40 minutes. A tunneling oxide may have a thickness in the general range of about 10 Å to about 100 Å, preferably about 10 Å to about 50 Å, even more preferably about 20 Å.

Figure 10A:
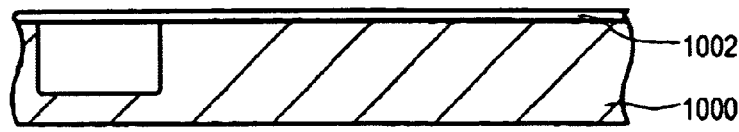
FIGS. 10A to 10E are side cross-sectional views showing the method of FIG. 9.

A portion of an integrated circuit following a step 902 is set forth in FIG. 10A. Referring to FIG. 10A, a portion of an integrated circuit may include a tunnel oxide layer 1002 formed on a substrate 1000.

A fifth embodiment 900 can continue by purging the wafer process furnace with a purging gas (step 906). A purging gas may comprise a nitrogen gas ($N_2$). A purging step may last for about 30 minutes.

A fifth embodiment 900 may also include forming an oxynitride layer within the same temperature range (as a previous oxidation step) and same processing furnace (step 908). In one particular example, forming such an oxynitride layer may include a low pressure chemical vapor deposition (LPCVD) of a nitride. More particularly, a silicon oxynitride may be formed with precursor gases that include ammonia ($NH_3$), nitrous oxide ($N_2O$), and dichlorosilane (DCS). An $NH_3$ flow rate may be in the general range of about 100 sccm to about 200 sccm, preferably about 125 sccm to about 175 sccm, more preferably about 150 sccm. In a preferred embodiment, $NH_3$ may be introduced into a reaction chamber 1–2 minutes prior to the other mentioned gases.

$N_2O$ flow rates may be in the general range of about 75 sccm to about 150 sccm, preferably about 100 sccm to about 125 seem, more preferably about 110 to about 117 sccm. DCS flow rates may be in the general range of about 25 sccm to about 100 sccm, preferably about 25 sccm to about 75 sccm, more preferably about 50 sccm. A chamber temperature may be in the general range of about 600° C. to about 1000° C., preferably about 700° C. to about 850° C., more preferably about 750° C. to about 810°C. A deposition time may be about 10 minutes to about 25 minutes, preferably about 12 minutes to about 20 minutes, more preferably about 15 minutes. A resulting silicon oxynitride layer may have a thickness in the general range of about 70 to about 120 Å, preferably about 80 to about 100 Å, more preferably about 95 Å.

Figure 10B:

A portion of an integrated circuit following a step 908 is set forth in FIG. 10B. Referring now to FIG. 10B, an integrated circuit portion may include an oxynitride layer 1004 deposited over a tunnel oxide layer 1002.

Referring back to FIG. 9, a fifth embodiment 900 can continue by purging the wafer process furnace with a purging gas (step 910). A purging gas may comprise a nitrogen gas ($N_2$). A purging step may last for about 30 minutes.

A fifth embodiment 900 may further include forming a top insulating layer in the same furnace and same temperature range (as an oxynitride layer). Further, such a step may include a preheated processing gas (step 912). A top insulating layer may include silicon dioxide. In one approach, such a silicon dioxide layer may be formed with precursor materials of $N_2O$ and DCS. $N_2O$ flow rates may be in the general range of about 20 sccm to about 60 sccm, preferably about 30 sccm to about 50 sccm, more preferably about 40 sccm. DCS flow rates may be in the general range of about 5 sccm to about 25 sccm, preferably about 10 sccm to about 20 sccm, more preferably about 14 sccm. A chamber temperature may be in the general range of about 600° C. to about 1000° C., preferably about 700 to about 850° C., more preferably about 750° C. to about 810° C. A deposition time may be about 15 minutes. A top insulating layer of silicon dioxide may have a thickness in the general range of about 20 Å to about 60 Å, preferably about 30 Å to about 50 Å, more preferably about 40 Å.

It is also noted that $N_2O$ may be initially introduced into a wafer processing furnace for 1–2 minutes before other reaction gases. $N_2O$ may be preheated to about 300° C. to about 500° C., more preferably about 400° C.

Figure 10C:

Referring to FIG. 10C, an example of a portion of an integrated circuit following step 912 is set forth. A top insulating layer 1006, oxynitride layer 1004 and tunnel oxide 1002 can be formed on a substrate 1000.

A method according to a fifth embodiment 900 can also include forming a conductive gate layer (step 914). A step 914 may include depositing a layer of polycrystalline and/or amorphous silicon (herein polysilicon). Such a polysilicon layer may be deposited with conventional techniques to a thickness in the general range of about 1,000 Å to about 3,000 Å, preferably about 1,500 Å to about 2,500 Å, more preferably about 2,000 Å.

It is noted that a step 914 may further include forming a gate protection insulator over a conductive gate layer. Such a gate protection insulator may comprise a silicon nitride and/or a silicon dioxide, preferably a silicon dioxide.

Figure 9:
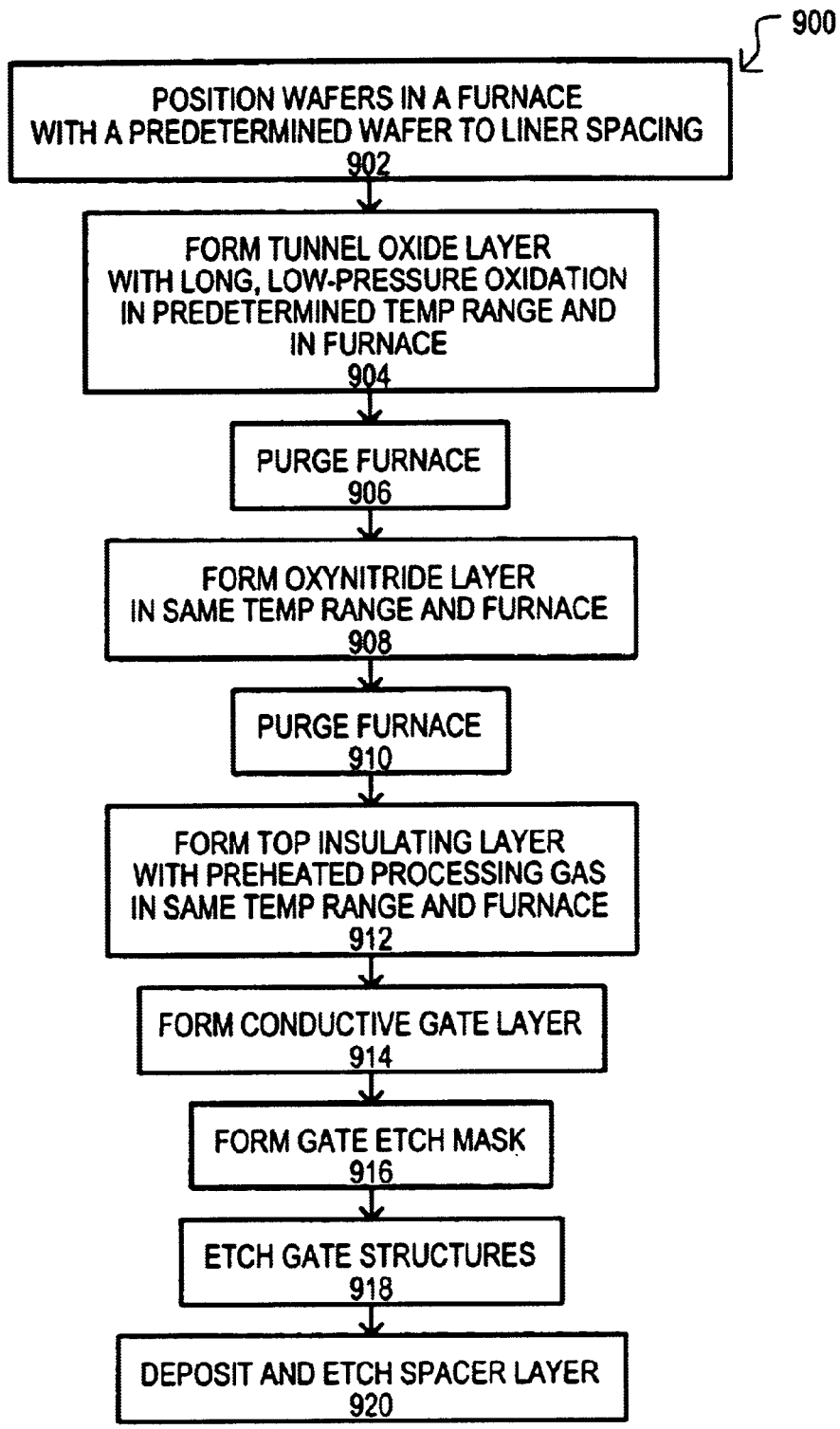
FIG. 9 is a block diagram showing a method of manufacturing an ONO dielectric for SONOS-type device according to another embodiment.

As shown in FIG. 9, a fifth embodiment 900 may further include forming a gate etch mask (step 916). Such a step may include forming gate etch masks over locations where nonvolatile memory transistors may be formed. Such a step may include conventional photolithography steps, or the like.

Figure 10D:
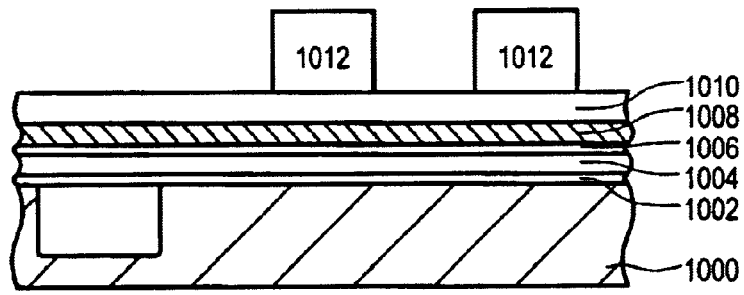

An example of a portion of an integrated circuit following steps 914 and 916 is set forth in FIG. 10D. Referring to FIG. 10D, a conductive gate layer 1008 can be deposited on a top insulating layer 1006. As also shown in FIG. 10D, a gate protection insulator 1010 may be formed over a conductive gate layer 1008. Still further, gate etch masks 1012 may be formed on a gate protection insulator 1010.

Etching gate structures (step 918) according to a fifth embodiment may include anisotropically etching with gate masks in place to form gate structures. Such etching may preferably include reactive ion etching.

It is also noted that following the formation of gate structures, one or more conventional ion implantation steps may take place to form particular impurity regions, such as lightly doped diffusions (i.e., lightly doped drains—LDD).

Following an etching of gate structures, a spacer layer may be deposited and etched to form spacers (step 920). A step 920 may include depositing a layer of silicon dioxide with tetraethylorthosilicate (TEOS) as a source material. A spacer layer may have a thickness of about 800 Å to about 2,000 Å, more preferably about 900 Å to about 1,500 Å, even more preferably about 1,100 Å. Such a spacer layer may then be etched back with an anisotropic etch, such as reactive ion etching (RIE), to from insulating spacers.

Figure 10E:
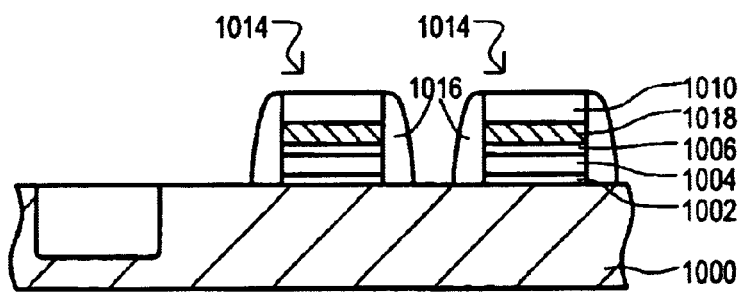
Figure 11:
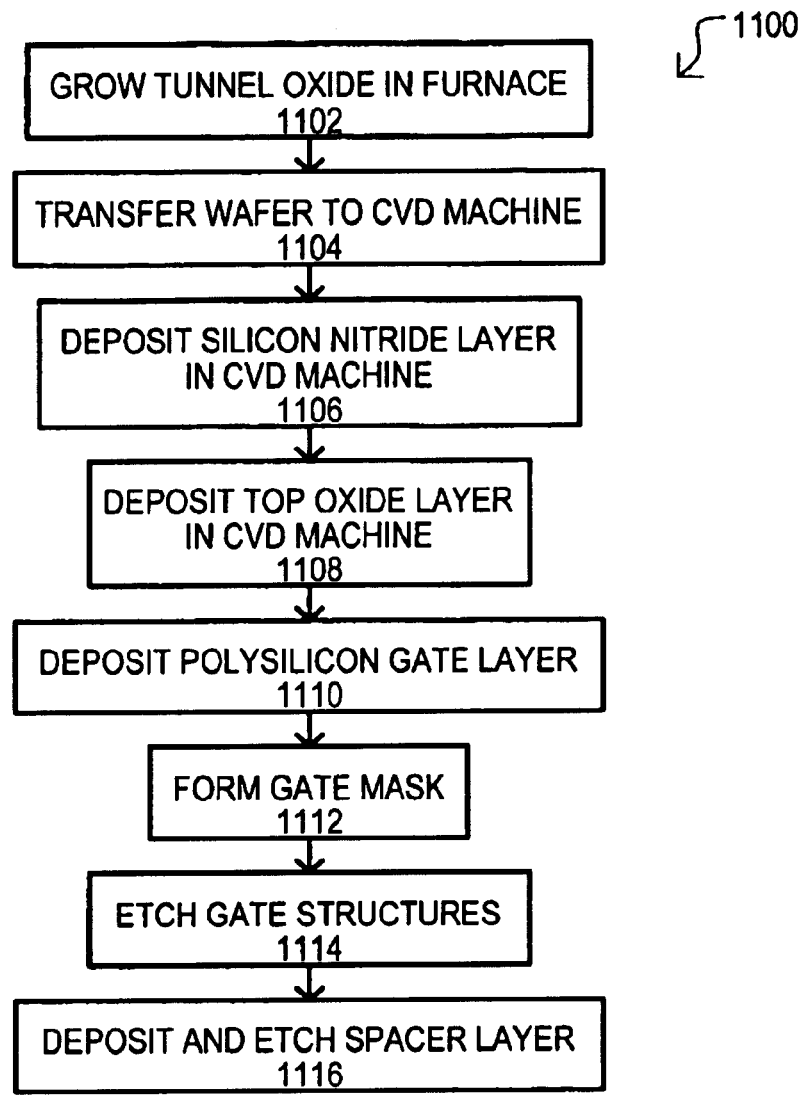
FIG. 11 is a block diagram showing the conventional method of manufacturing a SONOS-type device.
Figure 12A:
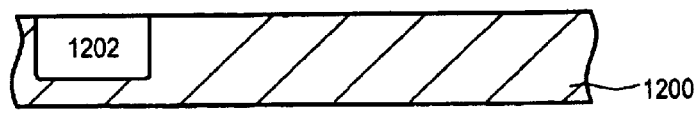
FIGS. 12A to 12F are side cross-sectional views showing the conventional method of FIG. 11.
Figure 12B:
Figure 12C:
Figure 12D:
Figure 12E:
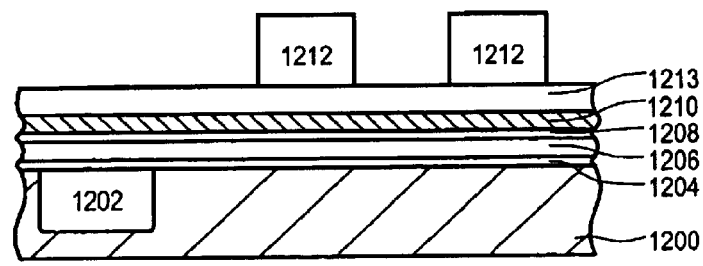
Figure 12F:
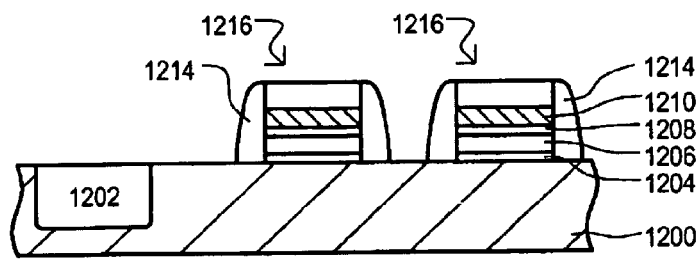

An example of a portion of an integrated circuit following step 918 and 920 is set forth in FIG. 10E. Referring to FIG. 10E, gate structures 1014 may be formed over a semiconductor substrate 1000. Each gate structure 1014 may form a nonvolatile transistor and include a tunneling oxide 1002, a charge storing layer 1004, a top insulating layer 1006, a conductive control gate 1018, and a gate protection insulator 1010. As also shown in FIG. 10E, insulating spacers 1016 may be formed on the sides of gate structures 1014.

The use of a single processing tool and temperature range, as described above, may reduce defects by minimizing a wafer's exposure to temperature variations and external environments. Further, such an approach may simplify a manufacturing process by localizing the formation of an ONO dielectric for SONOS-type device. Further, a processing cycle time may be improved by reducing transfers between machines. In addition, a preheating of a source gas and particular wafer-to-liner spacing may result in one or more layers of an ONO dielectric in a SONOS-type device having greater uniformity than other conventional approaches. As a result, a nonvolatile transistor manufactured according to fifth embodiment may have higher performance, may be more easily scaled to lower programming voltages than conventional approaches. At the same time, a fifth embodiment may be compatible with conventional CMOS processes, and hence more easily integrated into existing manufacturing process.

It is understood that while various embodiments have been described in detail, the present invention could be subject to various changes, substitutions, and alterations without departing from the spirit and scope of the invention. Accordingly, the present invention is intended to be limited only as defined by the appended claims.

What is claimed is:

1. A method for forming a plurality of semiconductor device layers, comprising the steps of:

forming a tunnel dielectric by oxidizing a silicon substrate in a wafer processing tool;

forming a charge retaining dielectric structure over the tunnel dielectric layer in the same wafer processing tool; and forming a top insulating layer over the charge retaining dielectric structure; wherein the tunnel dielectric layer is formed by oxidizing a silicon substrate at a pressure of less than 1.5 Torr for longer than one hour.

2. The method of claim 1, wherein:

the top insulating layer is formed in the same wafer processing tool.

3. The method of claim 1, wherein:

the tunnel dielectric layer, the charge retaining dielectric structure and top insulating layer are formed in the same reaction chamber of the wafer processing tool.

4. The method of claim 1, wherein:

the top insulating layer comprises silicon dioxide formed by chemical vapor deposition with nitrous oxide as a source gas that is preheated before entering a reaction chamber to more than 300° C.

5. The method of claim 1, wherein:

the tunnel dielectric layer, the charge retaining dielectric structure and top insulating layer together have a thickness of less than 200 angstroms.

6. The method of claim 1, wherein:

the tunnel dielectric layer comprises silicon dioxide, the charge retaining dielectric structure comprises silicon oxynitride, and the top insulating layer comprises silicon dioxide.

7. A method for forming a plurality of semiconductor device layers, comprising the steps of:

forming a charge retaining dielectric structure in a wafer processing tool over a tunnel dielectric layer formed in the same wafer processing tool, the tunnel dielectric being formed by oxidizing a silicon substrate; and forming a top insulating layer over the charge retaining dielectric structure; wherein forming the tunneling oxide, the charge retaining dielectric structure and top insulating layer occurs in the same reaction chamber of a wafer processing tool; and the tunnel dielectric layer, charge retaining dielectric structure, and top insulating layer are all formed at temperatures within 50° C. of one another.

8. A method of forming a multi-layered dielectric for a nonvolatile semiconductor device, comprising the steps of:

oxidizing a substrate in an oxygen containing atmosphere for more than 75 minutes and at a pressure of less than 1400 milliTorr to form a tunneling oxide;

forming a charge retaining dielectric structure over the tunneling oxide having a thickness of less than 120 angstroms; and forming a top insulating layer over the charge retaining dielectric structure.

9. The method of claim 8, further including:

prior to forming the charge retaining dielectric structure, situating at least one wafer containing the substrate in a reaction chamber having a liner that surrounds an outer edge of the wafer, the outer edge of the wafer being within 2.5 centimeters (cm) to 6.5 cm from the liner.

10. The method of claim 8, wherein:

forming the top insulating layer includes forming a silicon dioxide film with a silicon containing source gas and nitrous oxide that is preheated to more than 300° C.

11. The method of claim 10, wherein:

forming the charge retaining dielectric structure includes forming a silicon oxynitride film with a silicon containing source gas, a nitrogen containing source gas, and nitrous oxide.

12. A method of forming an ONO dielectric layer in a SONOS-type device, comprising the steps of:

forming a tunnel dielectric layer, charge retaining dielectric structure and top insulating layer on a plurality of wafers in a reaction chamber that contains a liner that surrounds the outer edges of the wafers, a spacing between the liner and the wafers being within the range of 2.5 centimeters (cm) to 6.0 cm.

13. The method of claim 12, wherein:

forming the tunnel dielectric layer includes oxidizing at least one surface of the wafers in an oxygen containing atmosphere for more than one hour and at a pressure of less than 1400 mTorr.

14. The method of claim 13, wherein:

the oxidizing occurs at a temperature in the range of 720° C. to 820° C.

15. The method of claim 14, wherein:

forming the charge retaining dielectric structure includes forming a layer of silicon oxynitride by chemical vapor deposition at a temperature within the range of 720° C. to 820° C.; and forming the top insulating layer includes forming a layer of silicon oxide by chemical vapor deposition at a temperature within the range of 720° C. to 820° C.

16. The method of claim 12, wherein:

forming the charge retaining dielectric structure includes forming a layer of silicon oxynitride by chemical vapor deposition at a temperature within the range of 720° C. to 820° C. with source gases that include nitrous oxide.

17. The method of claim 16, wherein:

the source gases further include dichlorosilane and ammonia.

18. The method of claim 12, wherein:

forming the top insulating layer includes forming a layer of silicon oxide by chemical vapor deposition at a temperature within the range of 720° C. to 820° C. with source gases that include nitrous oxide preheated to more than 300° C.

* * * * *